United States Patent
Huang

(10) Patent No.: US 12,501,556 B2
(45) Date of Patent: Dec. 16, 2025

(54) CONDUCTIVE SLURRY, WATERPROOF PRESSING STRUCTURE, CIRCUIT MEMBRANE AND FABRICATION METHOD THEREOF

(71) Applicant: Lite-On Technology Corporation, Taipei (TW)

(72) Inventor: Jen-Chieh Huang, Taipei (TW)

(73) Assignee: Life-On Technology Corporation, Taipei (TW)

( * ) Notice: Subject to any disclaimer, the term of this patent is extended or adjusted under 35 U.S.C. 154(b) by 351 days.

(21) Appl. No.: 18/187,689

(22) Filed: Mar. 22, 2023

(65) Prior Publication Data

US 2023/0309243 A1    Sep. 28, 2023

Related U.S. Application Data

(60) Provisional application No. 63/322,651, filed on Mar. 23, 2022.

(51) Int. Cl.
*H05K 1/09* (2006.01)
*H05K 3/10* (2006.01)
*H05K 3/34* (2006.01)

(52) U.S. Cl.
CPC ........... *H05K 3/3485* (2020.08); *H05K 1/092* (2013.01); *H05K 3/103* (2013.01); *H05K 2201/015* (2013.01); H05K 2201/0162 (2013.01); H05K 2203/1173 (2013.01)

(58) Field of Classification Search
CPC ....... H05K 1/092; H05K 3/3485; H05K 3/103
See application file for complete search history.

(56) References Cited

U.S. PATENT DOCUMENTS

2023/0098422 A1*  3/2023  Kwon ................. H01G 4/30
                                                29/25.03

FOREIGN PATENT DOCUMENTS

| CN | 103881532 | 6/2014 |
|---|---|---|
| CN | 108604480 | 9/2018 |
| CN | 108701508 | 10/2018 |
| CN | 112635221 | 4/2021 |
| CN | 113096849 | 7/2021 |
| CN | 113345624 | 9/2021 |

* cited by examiner

*Primary Examiner* — Jeremy C Norris
(74) *Attorney, Agent, or Firm* — JCIPRNET

(57) ABSTRACT

The disclosure provides a conductive slurry, which includes a conductive paste comprising polar materials and a hydrophobic agent mixed with the conductive paste. The hydrophobic agent includes solvent and hydrophobic particles. The solvent of the hydrophobic agent includes a non-polar material.

20 Claims, 9 Drawing Sheets

CONDUCTIVE SLURRY, WATERPROOF PRESSING STRUCTURE, CIRCUIT MEMBRANE AND FABRICATION METHOD THEREOF

CROSS-REFERENCE TO RELATED APPLICATION

This application claims the priority benefit of U.S. provisional application Ser. No. 63/322,651, filed on Mar. 23, 2022. The entirety of the above-mentioned patent application is hereby incorporated by reference herein and made a part of this specification.

BACKGROUND

Technical Field

The disclosure relates to a conductive slurry, a waterproof pressing structure, a circuit membrane and a fabrication method of the circuit membrane.

Description of Related Art

In general, a keyboard may include a cap, a connecting member, an elastic member and a circuit membrane. With the elastic restoring force of the elastic member, the cap of the keyboard can rebound after being pressed. The connecting member of the keyboard is used to support the cap, such that when the cap is pressed, the elastic member may be pressed by the connecting member and a downward pressure may be provided to the circuit membrane to activate a switch element in the circuit membrane.

When using the keyboard, if water enter the gap between the caps, the water may damage the circuit membrane. When no waterproof protection or treatment is provided for the keyboard, the circuit membrane in the keyboard may break down or malfunction. These problems need to be resolved.

SUMMARY

The disclosure is related to a conductive slurry, which is configured to fabricate a waterproof circuit.

The disclosure is related to a circuit membrane and a fabrication method thereof, wherein water can hardly be attached on a wiring structure of the circuit membrane and the waterproof performance can be improved.

The disclosure is related to a waterproof pressing structure used in a waterproof keyboard or a portable computer, wherein the waterproof pressing structure has good waterproof ability.

According to some embodiments of the disclosure, a conductive slurry includes a conductive paste including polar materials and a hydrophobic agent mixed with the conductive paste. The hydrophobic agent includes solvent and hydrophobic particles. The solvent of the hydrophobic agent includes a non-polar material.

In an embodiment according to the disclosure, the conductive slurry includes 95 wt % to 99 wt % of the conductive paste and 1% to 5% of the hydrophobic agent.

In an embodiment according to the disclosure, the hydrophobic agent includes 80 wt % to 90 wt % of the solvent and 10 wt % to 20 wt % of the hydrophobic particles.

In an embodiment according to the disclosure, the solvent of the hydrophobic agent comprises hydrocarbon and dibasic solvent.

In an embodiment according to the disclosure, a material of the hydrophobic particles is selected from at least one of organo-fluoro compounds, organo-silicone compounds, fluoro-silicone, perfluoropolyether and hydrophobic silanes.

In an embodiment according to the disclosure, the conductive paste comprises diethylene glycol monoethyl acetate, dibasic esters, thermoplastic resins and silver powder.

According to some embodiments of the disclosure, a circuit membrane includes a membrane and a wiring structure located on the membrane. The wiring structure includes a conductive material and hydrophobic material. A concentration of the hydrophobic material contained in a first portion of the wiring structure is greater than a concentration of the hydrophobic material contained in a second portion of the wiring structure. The second portion is located between the first portion and the membrane.

In an embodiment according to the disclosure, a portion of a surface of the wiring structure includes the hydrophobic material.

In an embodiment according to the disclosure, an adhesion of water on the membrane is stronger than the adhesion of water on the wiring structure.

In an embodiment according to the disclosure, a surface tension of the membrane is stronger than a surface tension of the wiring structure.

In an embodiment according to the disclosure, the wiring structure has a water contact angle of or greater than about 120°.

According to some embodiments of the disclosure, a fabrication method of a circuit membrane includes the following steps. A conductive slurry is applied on a membrane to form a patterned layer, wherein the conductive slurry includes a conductive paste and a hydrophobic agent mixed with the conductive paste, and wherein the hydrophobic agent comprises solvent and hydrophobic particles. A volatilization process is performed to remove liquid in the patterned layer to form a wiring structure, and at least a portion of the hydrophobic particles inside the patterned layer are transferred to a surface of the patterned layer during the volatilization process.

In an embodiment according to the disclosure, the conductive paste includes polar materials, and the solvent of the hydrophobic agent includes non-polar materials.

In an embodiment according to the disclosure, a surface tension of the membrane is stronger than a surface tension of the wiring structure.

According to some embodiments of the disclosure, a waterproof pressing structure includes a first membrane, a first wiring structure, a second membrane, a second wiring structure and an insulation layer. The first wiring structure has at least one first contact located on the first membrane, wherein the first wiring structure includes a conductive material and hydrophobic particles. The first wiring structure has a water contact angle of or greater than about 120°. The second wiring structure has at least one second contact located on the second membrane. The insulation layer is disposed between the first membrane and the second membrane. The insulation layer has an opening. The at least one first contact overlaps the at least one second contact in a direction corresponding to the opening.

In an embodiment according to the disclosure, the second wiring structure includes a same material of the first wiring structure.

In an embodiment according to the disclosure, a surface tension of the second membrane is stronger than a surface tension of the second wiring structure.

In an embodiment according to the disclosure, solvent of the hydrophobic agent includes non-polar materials.

In an embodiment according to the disclosure, a surface tension of the first membrane is stronger than a surface tension of the first wiring structure.

In an embodiment according to the disclosure, a material of the hydrophobic particles is selected from at least one of organo-fluoro compounds, organo-silicone compounds, fluoro-silicone, perfluoropolyether and hydrophobic silanes.

In an embodiment according to the disclosure, an amount of the hydrophobic particles located on a surface of the first wiring structure is greater than an amount of the hydrophobic particles located inside the first wiring structure.

To sum up, the hydrophobic particles of the wiring structure may improve the waterproof performance of the circuit membrane in the embodiments. In the process of forming the wiring structure, the hydrophobic particles may move to the surface of the wiring structure, such that the surface of the wiring structure has good waterproof ability.

DETAILED DESCRIPTION OF DISCLOSED EMBODIMENTS

Figure 1A:
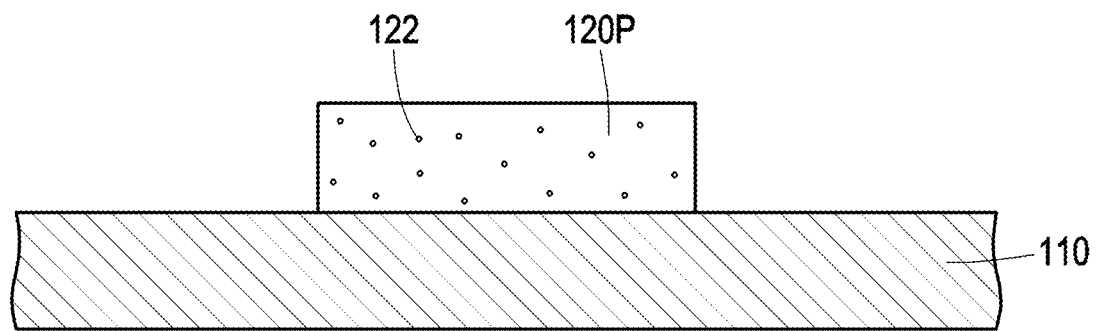
FIG. 1A to FIG. 1B are schematic diagrams of a fabrication method of a circuit membrane according to an embodiment of the disclosure.

References of the exemplary embodiments of the disclosure are to be made in detail. Examples of the exemplary embodiments are illustrated in the drawings. If applicable, the same reference numerals in the drawings and the descriptions indicate the same or similar parts.

According to some embodiments of the disclosure, a conductive slurry used to fabricate a waterproof circuit is provided. The conductive paste is formed by mixing a conductive paste with a hydrophobic agent.

The conductive paste includes polar materials. For example, the conductive paste includes solvent, polymers and conductive powder. The polymers and the conductive powder are distributed in the solvent. At least one of the solvent, the polymers and the conductive powder in the conductive paste may be polar materials. In some embodiments, the conductive paste is a silver paste including diethylene glycol monoethyl acetate, dibasic esters, thermoplastic resins and silver powder. Both of the diethylene glycol monoethyl acetate, the dibasic esters, the thermoplastic resins and the silver powder are polar materials. In some embodiments, the conductive paste includes 10 wt % to 17 wt % of the diethylene glycol monoethyl acetate, 24 wt % to 32 wt % of the dibasic esters, 7 wt % to 13 wt % of the thermoplastic resins and 45 wt % to 58 wt % of the silver powder.

The hydrophobic agent includes solvent and hydrophobic particles. In some embodiments, the hydrophobic agent includes 80 wt % to 90 wt % of the solvent and 10 wt % to 20 wt % of the hydrophobic particles. In some embodiments, the solvent of the hydrophobic agent includes at least one of hydrocarbon, dibasic solvent (e.g., isoparaffinic solvent) and other suitable materials. For example, the hydrophobic agent includes 40 wt % to 45 wt % of hydrocarbon and 40 wt % to 45 wt % of dibasic solvent and 10 wt % to 20 wt % of the hydrophobic particles. The solvent of the hydrophobic agent includes non-polar materials. In some embodiments, the solvent of the hydrophobic agent has a boiling point of 100 degrees Celsius to 220 degrees Celsius, thereby reducing the volatilization rate of the solvent.

In some embodiments, a material of the hydrophobic particles is selected from at least one of organo-fluoro compounds, organo-silicone compounds, fluoro-silicone, perfluoropolyether and hydrophobic silanes. In some embodiments, the aforementioned hydrophobic silanes may include methyl, linear alkyl, branched alkyl, fluorinated alkyl, aryl, dipodal, etc. For example, the hydrophobic agent includes 10 wt % to 20 wt % of organo-fluoro compounds. The material of the hydrophobic particles includes a non-polar material (e.g., the relative permittivity is less than 2.8) and/or a polar material with low polarity (e.g., the relative permittivity is between 2.8 and 3.6). When the material of the hydrophobic particles includes the polar material with low polarity, the polarity of the hydrophobic particles is lower than the polarity of materials in the solvent, the polymers and the conductive powder of the conductive paste.

The hydrophobic agent and the conductive paste are mixed together to form the conductive slurry. In some embodiments, the conductive slurry includes 98 wt % to 99.5 wt % of the conductive paste and 0.5 wt % to 2 wt % of the hydrophobic agent. Since the conductive paste includes non-polar materials and the hydrophobic agent includes polar materials, the hydrophobic particles of the hydrophobic agent are not prone to disperse evenly in the conductive slurry. The hydrophobic particles in the conductive slurry may gradually become unevenly distributed after standing still for a period of time. Therefore, it is better to stir the conductive slurry before using it.

Figure 1B:
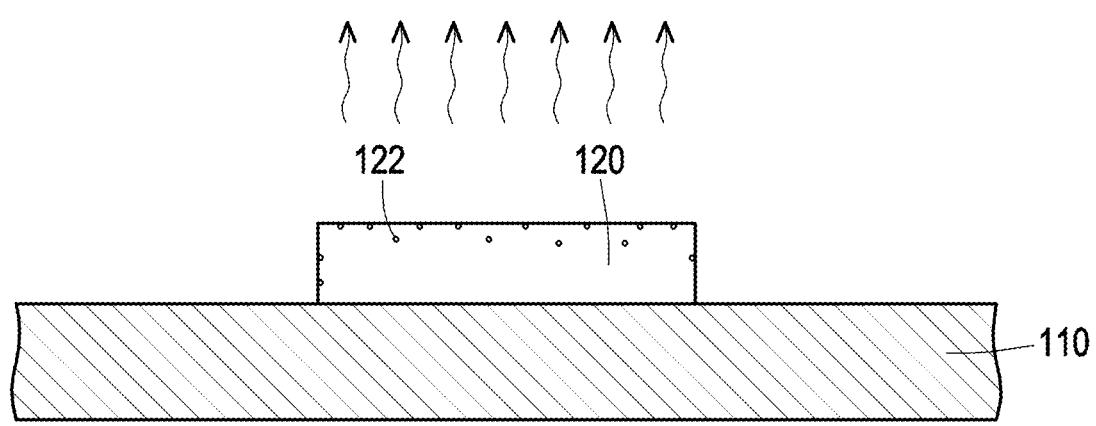

FIG. 1A to FIG. 1B are schematic diagrams of a fabrication method of a circuit membrane according to an embodiment of the disclosure. In order to clearly show the position of the hydrophobic particles 122, materials other than the hydrophobic particles 122 in the patterned layer 120P and the wiring structure 120 are simplified in FIG. 1A and FIG. 1B.

Referring to FIG. 1A, the conductive slurry including the conductive paste and the hydrophobic agent is applied on a first membrane 110 to form a patterned layer 120P. In some embodiments, a material of the first membrane 110 includes polyethylene terephthalate (PET), polycarbonate (PC), polymethyl methacrylate (PMMA), polyurethane (PU), or the likes. In some embodiments, the patterned layer 120P can be formed by printing or other suitable methods.

Referring to FIG. 1B, a volatilization process is performed to remove liquid in the patterned layer 120P to form the wiring structure 120 including a conductive material (e.g. the conductive powder in the conductive paste) and the hydrophobic particles. The liquid in the patterned layer 120P includes the solvent of the conductive paste and the solvent of the hydrophobic agent. During the volatilization process, the liquid inside the patterned layer 120P transfers to the surface of the patterned layer 120P. Since the hydrophobic particles 122 includes non-polar materials and/or polar materials with lower polarity and the conductive paste includes polar materials with higher polarity, the hydrophobic particles 122 is prone to migrate to the surface of the patterned layer 120P with the volatilized liquid. Therefore, at least a portion of the hydrophobic particles 122 inside the patterned layer 120P are transferred to the surface of the patterned layer 120P during the volatilization process. Such that, a concentration of the hydrophobic particles 122 located on the surface of the wiring structure 120 is greater than a concentration of the hydrophobic particles 122 located inside the wiring structure 120. In some embodiments, only a portion of the surface of the wiring structure 120 has hydrophobic particles 122. In the other words, the hydrophobic particles 122 do not cover the entire surface of the wiring structure 120.

Figure 2:
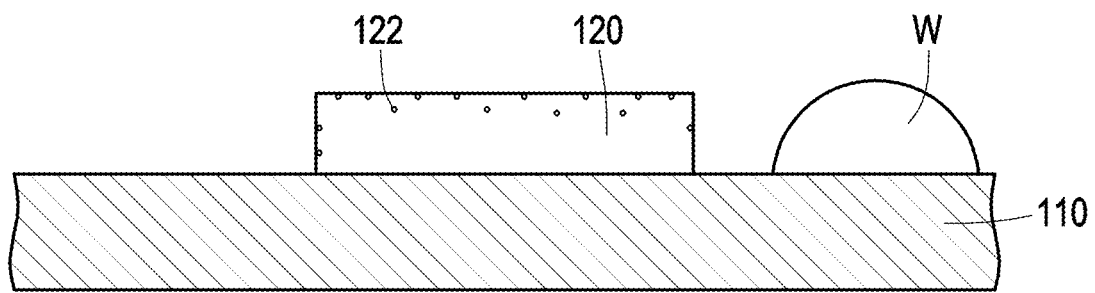
FIG. 2 is a schematic diagram of a circuit membrane with water according to an embodiment of the disclosure.

In some embodiments, a surface tension of the membrane 110 is stronger than a surface tension of the wiring structure 120. The hydrophobic particles 122 are used to reduce the surface tension of the wiring structure 120, such that the difference between the surface tension of the membrane 110 and the surface tension of the wiring structure 120 is increased by the hydrophobic particles 122 on the surface of the wring structure 120. Therefore, as shown in FIG. 2, water W tends to be attached on the membrane 110 rather than on the wiring structure 120. In some embodiments, the surface tension of the membrane 110 is larger than 32 Dyne/cm, and the surface tension of the wiring structure 120 is less than 20 Dyne/cm.

Figure 7:
FIG. 7 is a photograph of a water contact angle of a wring layer according to an embodiment of the disclosure.

An adhesion of water W on the membrane 110 is stronger than the adhesion of water W on the wiring structure 120. That is, water W can hardly be attached on the wiring structure 120 and the waterproof performance can be improved. In some embodiments, the wiring structure 120 has a water contact angle of greater than about 120°, such as 136.445° as shown in FIG. 7. The membrane 110 has a water contact angle of smaller than about 90°.

Compared with the wiring structure 120 with evenly dispersed hydrophobic particles 122, the wiring structure 120 with unevenly dispersed hydrophobic particles 122 can obtain better waterproof performance with less hydrophobic particles 122. The surface of the wiring structure 120 contains many hydrophobic particles 122, therefore, the wiring structure 120 has good surface waterproofing performance.

Figure 3C:
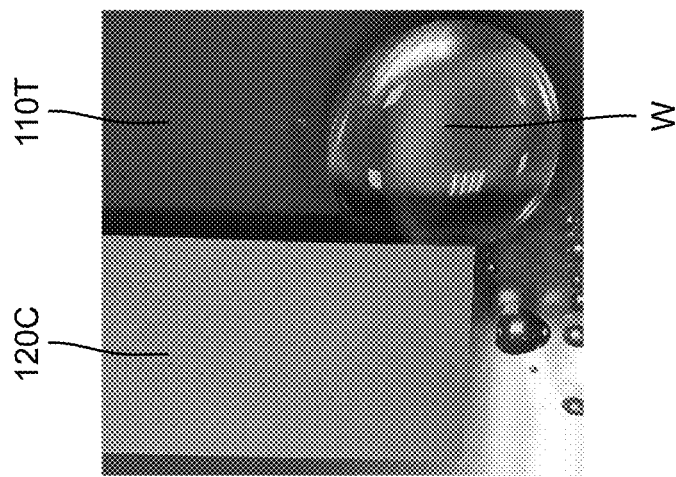
FIG. 3B and FIG. 3C are photographs of wring layers according to some embodiments of the disclosure.
Figure 3B:
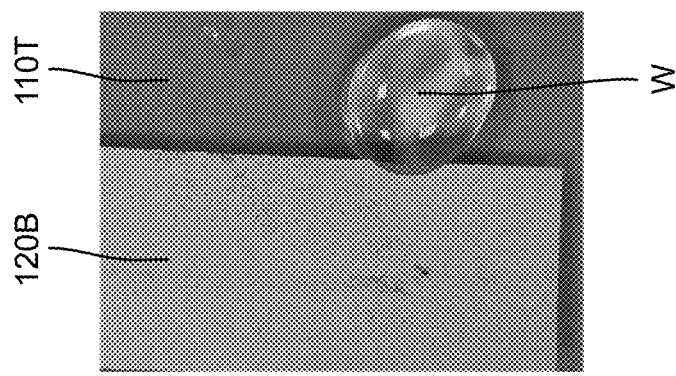
Figure 3A:
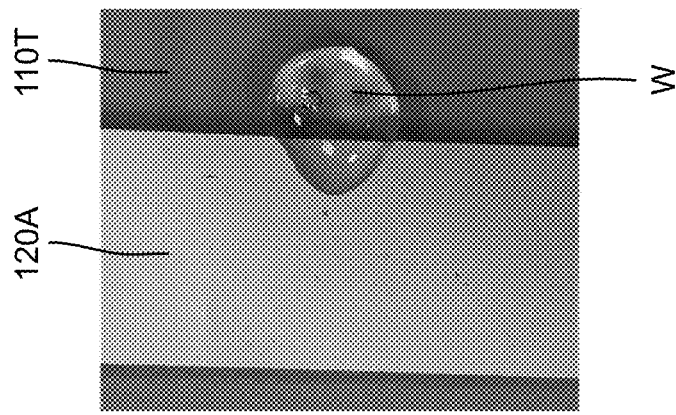
FIG. 3A is a photograph of a wring layer according to a comparative example of the disclosure.

FIG. 3A is a photograph of a wring layer according to a comparative example of the disclosure. FIG. 3B and FIG. 3C are photographs of wring layers according to some embodiments of the disclosure. In FIG. 3A to FIG. 3C, the wring layers 120A-120C are formed on the substrate 110T. A silver paste without hydrophobic agent is used to form the wring layer 120A. A silver paste is mixed with the hydrophobic agent to form the conductive slurry which is used to formed the wring layer 120B. A silver paste is mixed with the hydrophobic agent to form the conductive slurry which is used to formed the wring layer 120C.

In FIG. 3A to FIG. 3C, the substrate 110T is made of PET. In FIG. of FIG. 3B, the conductive slurry used to form the wring layer 120B includes 5 wt % of the hydrophobic agent and 95 wt % of the silver paste, and the hydrophobic agent includes 2 wt % organo-silicone compounds (the hydrophobic particles) and 98 wt % of solvent. In the embodiment of FIG. 3C, the conductive slurry used to form the wring layer 120C includes 5 wt % of the hydrophobic agent and 95 wt % of the silver paste, and the hydrophobic agent includes 2 wt % of organo-fluoro compounds (the hydrophobic particles) and 98 wt % of solvent.

As shown in FIG. 3A to FIG. 3C, the hydrophobic agent can effectively improve the waterproof performance of the wring layer. The waterproof performance of the wring layer 120C in FIG. 3C is better than the wring layer 120B in FIG. 3B.

Figure 4A:
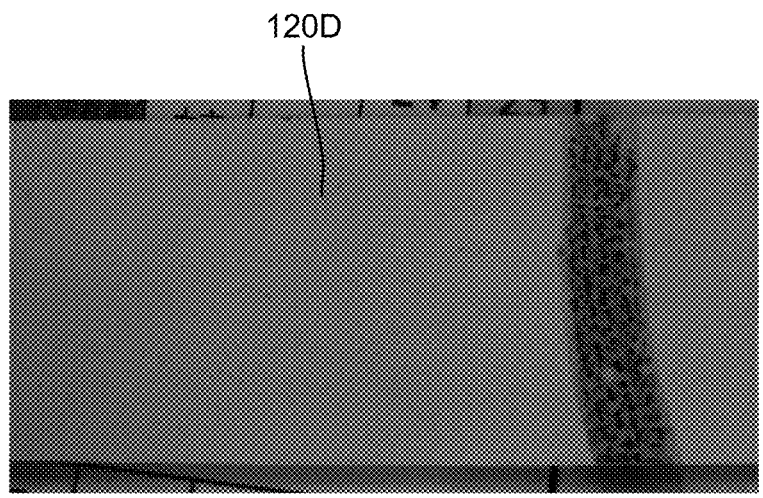
FIG. 4A to FIG. 4C are photographs of a surface tension test of wring layers according to some embodiments of the disclosure.
Figure 4B:
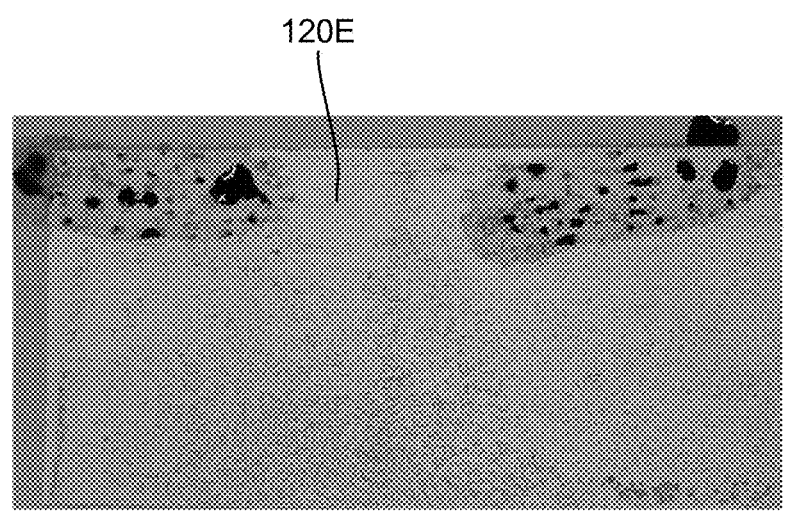
Figure 4C:
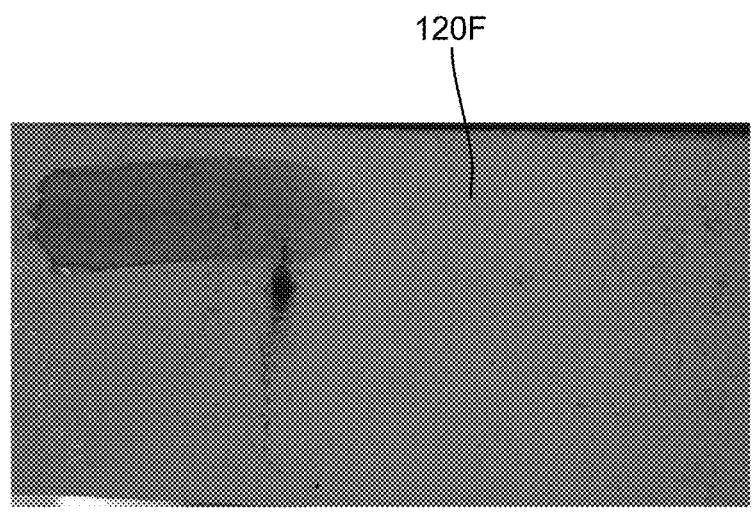

FIG. 4A to FIG. 4C are photographs of a surface tension test of wring layers according to some embodiments of the disclosure. The surface tension is measured by the Dyne pen method of 30 Dyne/cm.

In the embodiment of FIG. 4A, the weight ratio of the hydrophobic agent and the silver paste of the conductive slurry used to form the wring layer 120D is 1:1, and the hydrophobic agent includes 0.1 wt % of organo-silicone compounds (the hydrophobic particles) and 99.9 wt % of solvent. In the embodiment of FIG. 4A, the wring layer 120D is formed on a PET film with a surface tension of about 38 Dyne/cm. The surface tension of the wring layer 120D is about 30 Dyne/cm, as shown in FIG. 4A.

In the embodiment of FIG. 4B, the weight ratio of the hydrophobic agent and the silver paste of the conductive slurry used to form the wring layer 120E is 2:1, and the hydrophobic agent includes 0.1 wt % of organo-silicone compounds (the hydrophobic particles) and 99.9 wt % of solvent. In the embodiment of FIG. 4B, the wring layer 120E is formed on a PET film with a surface tension of about 38 Dyne/cm. The surface tension of the wring layer 120E is less than 30 Dyne/cm, as shown in FIG. 4B.

In the embodiment of FIG. 4C, the weight ratio of the hydrophobic agent and the silver paste of the conductive slurry used to form the wring layer 120F is 1:4, and the hydrophobic agent includes 1 wt % of organo-silicone compounds (the hydrophobic particles) and 99 wt % of solvent. In the embodiment of FIG. 4C, the wring layer 120F is formed on a PET film with a surface tension of about 38 Dyne/cm. The surface tension of the wring layer 120F is larger than 30 Dyne/cm, as shown in FIG. 4C.

Figure 5A:
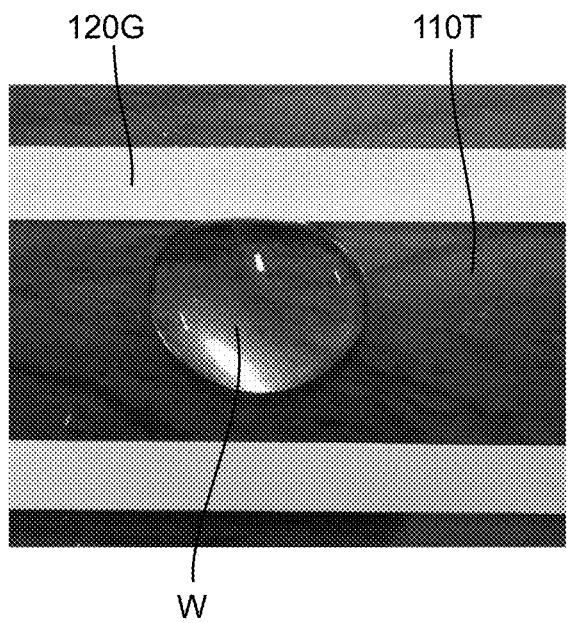
FIG. 5A and FIG. 5B are photographs of wring layers with water according to some embodiments of the disclosure.
Figure 5B:
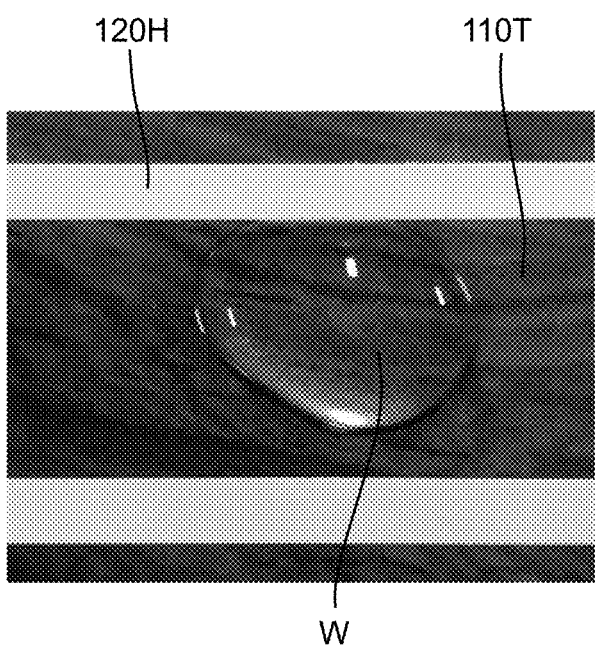

FIG. 5A and FIG. 5B are photographs of wring layers with water according to some embodiments of the disclosure. In FIG. 5A, a wring layer 120G with a surface tension of less than 30 Dyne/cm is a formed on the substrate 110T with a surface tension of about 38 Dyne/cm. A silver paste is mixed with the hydrophobic agent to form the conductive slurry which is used to formed the wring layer 120G. In FIG. 5B, a wring layer 120H with a surface tension of less than 30 Dyne/cm is formed on the substrate 110T with a surface tension of about 38 Dyne/cm. A silver paste is mixed with the hydrophobic agent to form the conductive slurry which is used to formed the wring layer 120H.

In the embodiment of FIG. 5A, the conductive slurry used to form the wring layer 120G includes 1 wt % of the hydrophobic agent and 99 wt % of the silver paste, and the hydrophobic agent includes 10 wt % of organo-fluoro compound (the hydrophobic particles) and 90 wt % of solvent. In the embodiment of FIG. 5B, the conductive slurry used to form the wring layer 120H includes 2 wt % of the hydrophobic agent and 98 wt % of the silver paste, and the hydrophobic agent includes 10 wt % of organo-fluoro compound (the hydrophobic particles) and 90 wt % of solvent.

As shown in FIG. 5A and FIG. 5B, water W is difficult to be adhered on the wring layer 120G and the wring layer 120H.

Figure 6C:
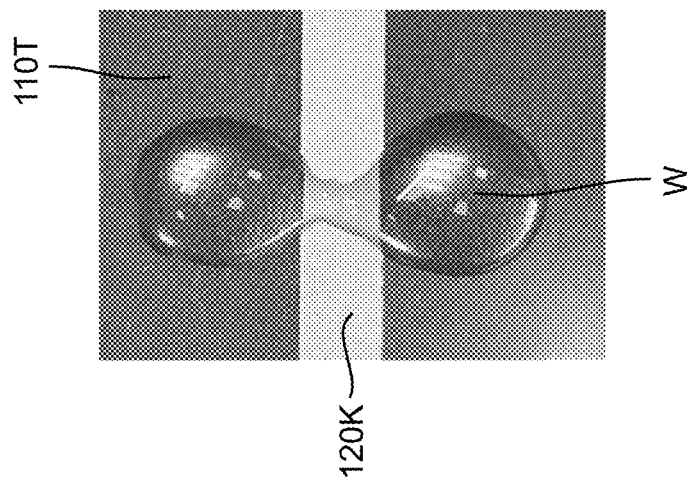
FIG. 6A to FIG. 6C are photographs of wring layers with water according to some embodiments of the disclosure.
Figure 6B:
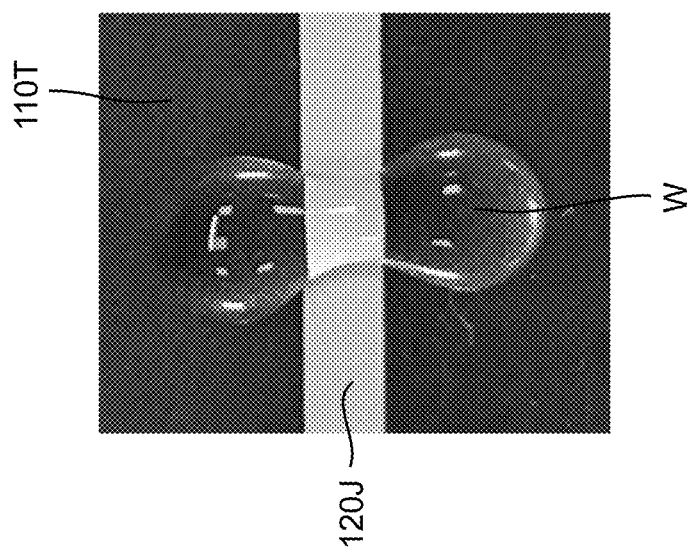
Figure 6A:
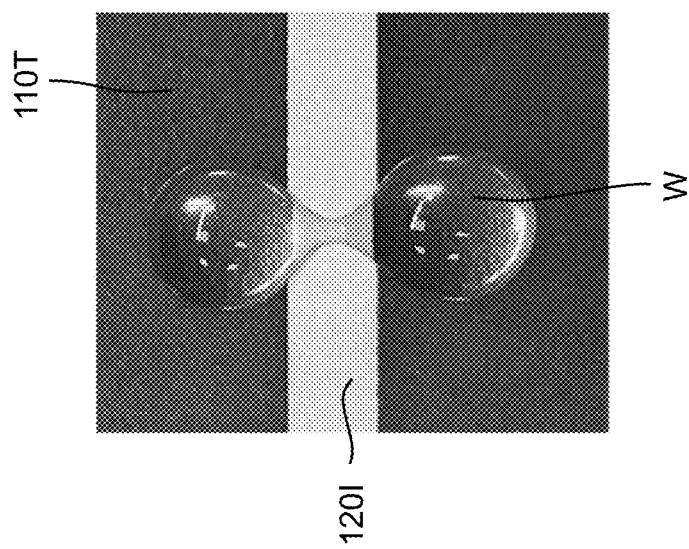

FIG. 6A to FIG. 6C are photographs of wring layers with water according to some embodiments of the disclosure. In FIG. 6A to FIG. 6C, the wring layers are formed on the substrate 110T.

In FIG. 6A to FIG. 6C, the substrate 110T is made of PET. In the embodiment of FIG. 6A, the conductive slurry used to form the wring layer 120I includes a hydrophobic agent and a silver paste, and the solvent of the hydrophobic agent includes Ethylene glycol monobutyl ether (BCS) and hydrocarbon. In the embodiment of FIG. 6B, the conductive slurry used to form the wring layer 120J includes a hydrophobic agent and a silver paste, and the solvent of the hydrophobic agent includes BCS and 3M™ Novec™ 7200 Engineered Fluid. In the embodiment of FIG. 6C, the conductive slurry used to form the wring layer 120K includes a hydrophobic agent and a silver paste, and the solvent of the hydrophobic agent includes 3M™ Novec™ 7200 Engineered Fluid and octanol. Comparing FIG. 6A to FIG. 6C, the width of water W on the wring layer 120I is the thinnest, so that the wring layer 120I in FIG. 6A has better waterproof performance.

Figure 8A:
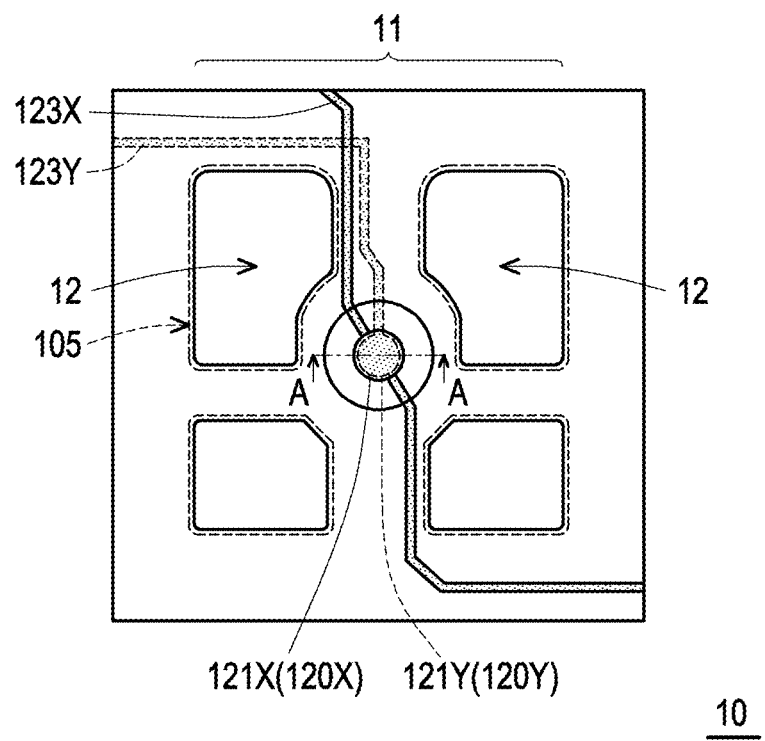
FIG. 8A is a schematic diagram of a waterproof pressing structure according to an embodiment of the disclosure.
Figure 8B:
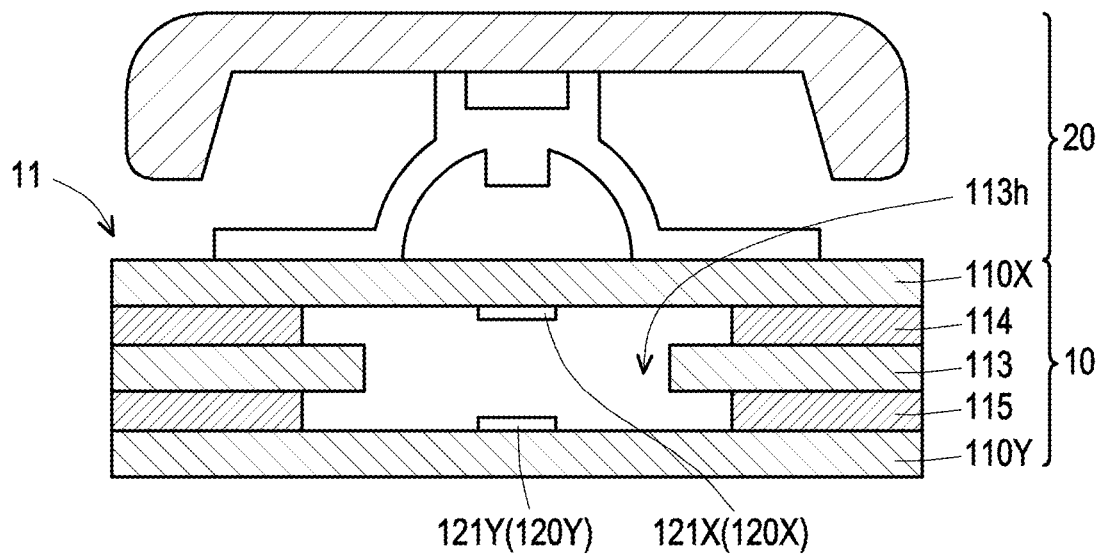
FIG. 8B is a cross-sectional view of a waterproof pressing structure according to an embodiment of the disclosure.

As indicated in FIG. 8A, the circuit membrane 10 is used in a keyboard structure or a portable computer to receive a pressing signal from a user and further transmit the pressing signal to a processor, and then the processor performs a corresponding command or function. The keyboard structure may include multiple keys 20 (only one is illustrated in FIG. 8B). The keys 20 can be letter keys, number keys, symbol keys, function keys or keys with an indicator. The keyboard structure can be a wireless keyboard, a gaming keyboard, a backlight keyboard, a touch keyboard, an ultra-thin and flat keyboard or an optical axis keyboard, and the invention does not have specific restrictions regarding the said exemplification.

As indicated in FIG. 8A, the circuit membrane 10 has at least one waterproof pressing structure 11 and multiple opening portions 12, wherein the waterproof pressing structure 11 is correspondingly disposed under each of the keys 20 (as indicated in FIG. 8B) to form a waterproof switch. The opening portions 12 are disposed in the surrounding area of the waterproof pressing structure 11, wherein each of the keys 20 and the pivot hooks of a bottom plate (not illustrated in the diagram) disposed under the keys 20 are connected through the opening portions 12.

Refer to FIG. 8B. The waterproof pressing structure 11 includes a first membrane 110X, a first wiring structure 120X having at least one first contact 121X, a second membrane 110Y, a second wiring structure 120Y having at least one second contact 121Y, and an insulation layer 113. The first wiring structure 120X is located on the first membrane 110X, the second wiring structure 120Y is located on the second membrane 110Y, the insulation layer 113 is interposed between the first membrane 110X and the second membrane 110Y, wherein the first membrane 110X, the second membrane 110Y and the insulation layer 113 are stacked in a vertical direction. In some embodiments, the insulation layer 113 has an opening 113h corresponding to the waterproof pressing structure 11, and the at least one first contact 121X overlaps the at least one second contact 121Y in the vertical direction and corresponding to the opening 113h.

The first wiring structure 120X and the second wiring structure 120Y can be formed by the conductive paste disclosed in any of the foregoing embodiments. For the description of the conductive paste, please refer to the previous content, and will not be repeated here.

Each of the first wiring structure 120X and the second wiring structure 120Y comprises a conductive material and hydrophobic particles. An amount of the hydrophobic particles located on a surface of the first wiring structure 120X is greater than an amount of the hydrophobic particles located inside the first wiring structure 120X. An amount of the hydrophobic particles located on a surface of the second wiring structure 120Y is greater than an amount of the hydrophobic particles located inside the second wiring structure 120Y. In some embodiments, the second wiring structure 120Y is made from the same material with the first wiring structure 120X. In some embodiments, the second membrane 110Y is made from the same material with the first membrane 110X. In some embodiments, a surface tension of the first membrane 110X and a surface tension of the second membrane 110Y are stronger than a surface tension of the first wiring structure 110X and a surface tension of the second wiring structure 110Y, respectively.

To avoid water entering the waterproof pressing structure 11 via the opening portions 12, in an embodiment, the surrounding area of the opening portions 12 is processed with a waterproof treatment (such as soaking the hydrophobic liquid 105 as indicated in dotted lines), such that the water cannot be attached on the opening portions 12. When water enters the keyboard, the water can only be attached on the membrane or the bottom plate having a strong adhesion for water, but not the surrounding area of the opening portions 12 which has been processed with a hydrophobic treatment and therefore has a weaker adhesion for water. Thus, the waterproof and hydrophobic functions can be achieved.

As indicated in FIG. 8A, the circuit membrane 10 further includes a first wiring layer 123X and a second wiring layer 123Y, respectively located on two membranes (e.g. the first membrane 110X and the second membrane 110Y in FIG. 8B), wherein the first wiring layer 123X is electrically connected to the first contact 121X, and the second wiring layer 123Y is electrically connected to the second contact 121Y, and the first wiring layer 123X and the second wiring layer 123Y can be formed of copper, silver or other conductive materials. The user can press the waterproof pressing structure 10 to generate a pressing signal and conduct the first wiring layer 123X and the second wiring layer 123Y to transmit the pressing signal to the processor, and then the processor performs a corresponding command or function. Detailed descriptions of the structures and a cross-sectional view along a cross sectional line A-A of the waterproof pressing structures 10 can be obtained with reference to FIG. 8B.

Besides, the waterproof pressing structure 10 may include a first adhesive layer 114 and a second adhesive layer 115, wherein the first adhesive layer 114, such as a waterproof adhesive, is interposed between the first membrane 110X and the insulation layer 113, and the second adhesive layer 115, such as a waterproof adhesive, is interposed between the second membrane 110Y and the insulation layer 113. The first contact 121X and the second contact 121Y form a pressing contact area defined by an area surrounded by the first membrane 110X, the second membrane 110Y and the insulation layer 113, such that the first contact 121X and the second contact 121Y keep a predetermined gap in a normal status (the first contact 121X and the second contact 121Y contact each other only when pressed but do not contact each other in the normal status).

Finally, it should be noted that the foregoing embodiments are only used to illustrate the technical solutions of the disclosure, but not to limit the disclosure; although the disclosure has been described in detail with reference to the foregoing embodiments, persons of ordinary skill in the art should understand that the technical solutions described in the foregoing embodiments may still be modified, or parts or all of the technical features thereof may be equivalently replaced; however, these modifications or substitutions do not deviate the essence of the corresponding technical solutions from the scope of the technical solutions of the embodiments of the disclosure.

What is claimed is:

1. A conductive slurry, comprising:
   a conductive paste comprising polar materials; and
   a hydrophobic agent mixed with the conductive paste and comprising solvent and hydrophobic particles, wherein the solvent of the hydrophobic agent comprises a non-polar material.

2. The conductive slurry according to claim 1, comprising 95 wt % to 99 wt % of the conductive paste and 1 wt % to 5 wt % of the hydrophobic agent.

3. The conductive slurry according to claim 1, wherein the hydrophobic agent comprises 80 wt % to 90 wt % of the solvent and 10 wt % to 20 wt % of the hydrophobic particles, wherein the solvent of the hydrophobic agent comprises hydrocarbon and dibasic solvent.

4. The conductive slurry according to claim 1, wherein a material of the hydrophobic particles is selected from at least one of organo-fluoro compounds, organo-silicone compounds, fluoro-silicone, perfluoropolyether and hydrophobic silanes.

5. The conductive slurry according to claim 1, wherein the conductive paste comprises diethylene glycol monoethyl acetate, dibasic esters, thermoplastic resins and silver powder.

6. A circuit membrane, comprising:
   a membrane; and
   a wiring structure located on the membrane, wherein the wiring structure comprises a conductive material and a hydrophobic material, wherein a concentration of the hydrophobic material contained in a first portion of the wiring structure is greater than a concentration of the hydrophobic material contained in a second portion of the wiring structure, and the second portion is located between the first portion and the membrane.

7. The circuit membrane according to claim 6, wherein a portion of a surface of the wiring structure comprises the hydrophobic material.

8. The circuit membrane according to claim 6, wherein an adhesion of water on the membrane is stronger than the adhesion of water on the wiring structure.

9. The circuit membrane according to claim 6, wherein a surface tension of the membrane is stronger than a surface tension of the wiring structure.

10. The circuit membrane according to claim 6, wherein the wiring structure has a water contact angle of or greater than about 120°.

11. A fabrication method of a circuit membrane, comprising:
    applying a conductive slurry on a membrane to form a patterned layer, wherein the conductive slurry comprises a conductive paste and a hydrophobic agent mixed with the conductive paste, and wherein the hydrophobic agent comprises solvent and hydrophobic particles; and
    performing a volatilization process to form a wiring structure, wherein at least a portion of the hydrophobic particles inside the patterned layer are transferred to a surface of the patterned layer during the volatilization process.

12. The fabrication method according to claim 11, wherein the conductive paste comprises polar materials, and the solvent of the hydrophobic agent comprises a non-polar material.

13. The fabrication method according to claim 11, wherein the wiring structure has a water contact angle of or greater than about 120°.

14. A waterproof pressing structure, comprising:
    a first membrane;
    a first wiring structure having at least one first contact located on the first membrane, wherein the first wiring structure comprises a conductive material and hydrophobic particles, wherein the first wiring structure has a water contact angle of or greater than about 120°;
    a second membrane;
    a second wiring structure having at least one second contact located on the second membrane; and
    an insulation layer disposed between the first membrane and the second membrane, wherein the insulation layer has an opening, and the at least one first contact overlaps the at least one second contact corresponding to the opening.

15. The waterproof pressing structure to claim 14, wherein the second wiring structure is made from a same material with the first wiring structure.

16. The waterproof pressing structure to claim 14, wherein the second wiring structure comprises the conductive material and the hydrophobic particles, wherein an amount of the hydrophobic particles located on a surface of the second wiring structure is greater than an amount of the hydrophobic particles located inside the second wiring structure.

17. The waterproof pressing structure according to claim 14, wherein a surface tension of the first membrane is stronger than a surface tension of the first wiring structure.

18. The waterproof pressing structure according to claim 14, wherein an amount of the hydrophobic particles located on a surface of the first wiring structure is greater than an amount of the hydrophobic particles located inside the first wiring structure.

19. The waterproof pressing structure according to claim 14, wherein a material of the hydrophobic particles is selected from at least one of organo-fluoro compounds, organo-silicone compounds, fluoro-silicone, perfluoropolyether and hydrophobic silanes.

20. The waterproof pressing structure according to claim 14, wherein only a portion of the surface of the first wiring structure has the hydrophobic particles.

* * * * *